United States Patent
Bai et al.

(10) Patent No.: US 9,813,082 B2
(45) Date of Patent: Nov. 7, 2017

(54) HEAT SPREADER WITH THERMALLY CODUCTIVE FOAM CORE

(71) Applicant: Futurewei Technologies, Inc., Plano, TX (US)

(72) Inventors: Mo Bai, San Jose, CA (US); Vadim Gektin, San Jose, CA (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 14/878,894

(22) Filed: Oct. 8, 2015

(65) Prior Publication Data

US 2017/0104500 A1     Apr. 13, 2017

(51) Int. Cl.
| | | |
|---|---|---|
| *G06F 1/20* | (2006.01) | |
| *H05K 7/20* | (2006.01) | |
| *H04B 1/036* | (2006.01) | |
| *F28F 13/00* | (2006.01) | |
| *H01L 23/34* | (2006.01) | |
| *H01L 23/367* | (2006.01) | |

(52) U.S. Cl.
CPC .......... *H04B 1/036* (2013.01); *F28F 13/003* (2013.01); *G06F 1/20* (2013.01); *H01L 23/34* (2013.01); *H01L 23/3672* (2013.01); *H05K 7/2039* (2013.01); *H05K 7/20854* (2013.01)

(58) Field of Classification Search
CPC ............ G06F 1/20; G06F 1/203; G06F 1/206; H05K 7/2039; H05K 7/20409; H05K 7/20436; H05K 7/20854; H04B 1/036; H01L 23/34; H01L 23/36; H01L 23/3672; H01L 23/3677

USPC ......... 361/679.46, 679.52, 679.54, 688, 696, 361/697, 702, 709, 714–724; 165/104.11
See application file for complete search history.

(56) References Cited

U.S. PATENT DOCUMENTS

| | | | | |
|---|---|---|---|---|
| 5,388,692 A | * | 2/1995 | Withrow | F21V 33/0052 206/305 |
| 5,808,866 A | * | 9/1998 | Porter | H05K 7/1424 174/377 |
| 5,816,314 A | * | 10/1998 | Wiggs | F24J 3/083 165/134.1 |
| 5,828,339 A | * | 10/1998 | Patel | H01Q 1/246 343/700 MS |
| 5,889,837 A | * | 3/1999 | Sands | H04M 3/30 379/26.02 |
| 6,424,533 B1 | * | 7/2002 | Chu | H01L 23/38 257/930 |
| 7,436,059 B1 | * | 10/2008 | Ouyang | H01L 23/34 257/712 |
| 7,847,658 B2 | * | 12/2010 | Lyons | C08J 9/0066 333/202 |

(Continued)

FOREIGN PATENT DOCUMENTS

EP          0559092 A1 *    9/1993  ........... H01L 23/373

OTHER PUBLICATIONS

Huawei Technologies Co. Ltd., "eLTE3.1 DBS3900 LTE FDD", Product Description, Issue 01, Jun. 30, 2013, 26pp.

(Continued)

*Primary Examiner* — Duc M Nguyen
(74) *Attorney, Agent, or Firm* — Slater Matsil, LLP

(57) ABSTRACT

A heat spreader and a method for making a heat spreader are disclosed. In an embodiment the heat spreader includes an enclosure with a hollow core and a foam core located in the hollow core.

15 Claims, 4 Drawing Sheets

(56) References Cited

U.S. PATENT DOCUMENTS

| | | | | |
|---|---|---|---|---|
| 8,072,298 B2* | 12/2011 | Kim | H01P 1/2053 | 29/600 |
| 9,232,682 B2* | 1/2016 | Liu | H01L 23/38 | |
| 2003/0138613 A1* | 7/2003 | Thoman | H01L 23/3733 | 428/292.1 |
| 2004/0123980 A1* | 7/2004 | Queheillalt | C23C 14/046 | 165/133 |
| 2005/0121776 A1* | 6/2005 | Deppisch | H01L 23/42 | 257/712 |
| 2008/0043428 A1* | 2/2008 | Ali | G06F 1/203 | 361/679.52 |
| 2008/0135212 A1* | 6/2008 | Queheillalt | C23C 14/046 | 165/104.13 |
| 2009/0034188 A1* | 2/2009 | Sween | G06F 1/203 | 361/679.49 |
| 2012/0087090 A1* | 4/2012 | Feng | F28D 15/0233 | 361/700 |
| 2012/0241073 A1* | 9/2012 | Wiest | B29C 44/3461 | 156/62.2 |
| 2013/0008630 A1* | 1/2013 | Yuan | H01L 23/427 | 165/104.21 |
| 2013/0299125 A1* | 11/2013 | Shi | H01L 23/467 | 165/47 |
| 2014/0024413 A1* | 1/2014 | Sun | H04W 88/085 | 455/561 |
| 2014/0103947 A1* | 4/2014 | Phan | G01R 31/003 | 324/750.05 |
| 2015/0031415 A1* | 1/2015 | Liu | H01L 23/38 | 455/561 |
| 2015/0223288 A1* | 8/2015 | Esseghir | B22F 3/1103 | 428/306.6 |
| 2015/0236391 A1* | 8/2015 | Esseghir | H01P 1/207 | 428/613 |
| 2016/0067888 A1* | 3/2016 | Shome | B29C 35/0805 | 156/275.5 |

OTHER PUBLICATIONS

Huawei Technologies Co. Ltd., "eWBB TDD 3.0 DBS3900", Product Description, Issue 01, Sep. 30, 2012, 24pp.

* cited by examiner

HEAT SPREADER WITH THERMALLY CODUCTIVE FOAM CORE

TECHNICAL FIELD

The present invention relates generally to a heat spreader and a method for making a heat spreader, and in particular embodiments, to a heat spreader of a remote radio unit (RRU) and a method for making such RRU heat spreader.

BACKGROUND

The cooling capacity for large heat exchangers or spreaders in information and communication products needs to increase permanently. Therefore the heat exchangers become increasingly heavier. The industry is seeking all kinds of ways to reduce weight while keeping up with the cooling requirements.

SUMMARY

In accordance with an embodiment of the present invention, a heat spreader comprises an enclosure with a hollow core and a foam core located in the hollow core.

In accordance with an embodiment of the present invention, a remote radio unit comprises a base body, a cover covering the base body and forming a box and electronic equipment located inside the box, wherein the base body or the cover comprises an enclosure with a hollow core and a foam core located in the hollow core.

In accordance with an embodiment of the present invention, a method for manufacturing a heat spreader comprises providing a heat spreader frame, providing a foam core and applying a fixing material to the heat spreader frame or the foam core. The method further comprises placing the foam core in the heat spreader frame and forming the heat spreader by enclosing the foam core.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Large telecommunication devices such as remote radio units (RRU) generate substantial amounts of heat during operation. The heat must be transferred away from the electronic equipment such as boards and chips so that the electronic equipment can properly operate at certain temperature ranges. These large telecommunication devices typically comprise a heat spreader, heat exchanger or heat sink on which the electronic equipment is mounted. A problem with the conventional heat exchangers or heat spreaders is that they are heavy and account for a majority percentage of the total weight of the spreaders and the electronic equipment.

Embodiments of the invention provide a light weight heat spreader with the same or similar structural rigidity than the original solid heat spreader. Embodiments of the invention provide a heat spreader with a hollow core, wherein the hollow core is filled with a thermally conductive foam material. The thermally conductive foam material may comprise a light thermally conductive material having pores or voids. The voids may comprise air, or in some embodiments, another light stuffing material. In some embodiments the heat spreader is partitioned into a plurality of hollow cores and each hollow core may be filled with the thermally conductive foam.

An advantage is that the weight of the inventive heat spreader is reduced by about 30%-70% or 40%-60% compared to a conventional heat spreader having a solid structure, wherein the inventive heat spreader and the conventional spreader comprises the same outside material.

Figure 1:
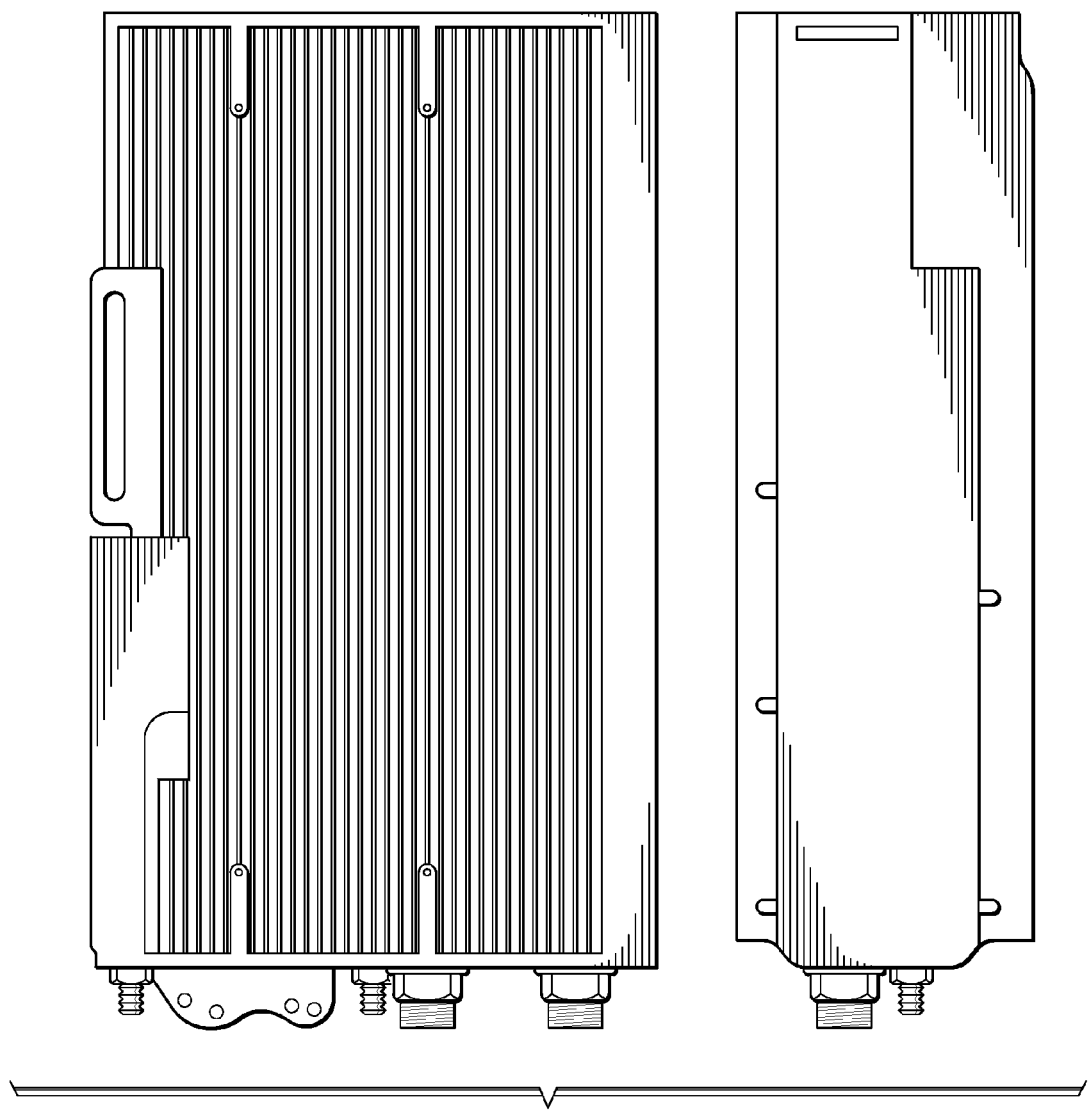
FIG. 1 shows remote radio unit (RRU)

FIG. 1 shows a RRU having a box structure. The RRU comprises a base body and a lid or cover. The electronic equipment may be mounted on or to the base body and the lid or cover may enclose the electronic equipment. The base body may be a rear side of the RRU which can be affixed to a wireless tower while the lid or cover is the front side. The lid or cover may comprise cooling fins or other heat dissipating structures. In some embodiments the base body comprises cooling fins or other heat dissipating structures too.

The electronic equipment is located inside the box. The electronic equipment may be mounted to the base body. The electronic equipment may comprise one or more boards (e.g., PCBs) and semiconductor chips disposed on the boards. The material of the base body and the cover or cooling panel may be a heat conductive material such as aluminum or an aluminum alloy. In alternative embodiments the material of the base body and the cover or cooling panel may be another heat conductive material such as copper or a copper alloy, titanium or a titanium alloy or other light metals. In yet some embodiments the base body and the cover or cooling panel may comprise a thermally conductive plastic material. The base body and the cover may not necessarily comprise the same material.

In some embodiments the RRU (e.g., box) comprises a lengths of 460 mm to 500 mmm, e.g., 480 mm, a width of 260 mm to 280 mm, e.g., 270 mm and a height of 130 mm to 150 mm, e.g., 140 mm. The RRU can be enclosed or protected with shells covering the box which increases the size of the RRU somewhat.

Figure 2:
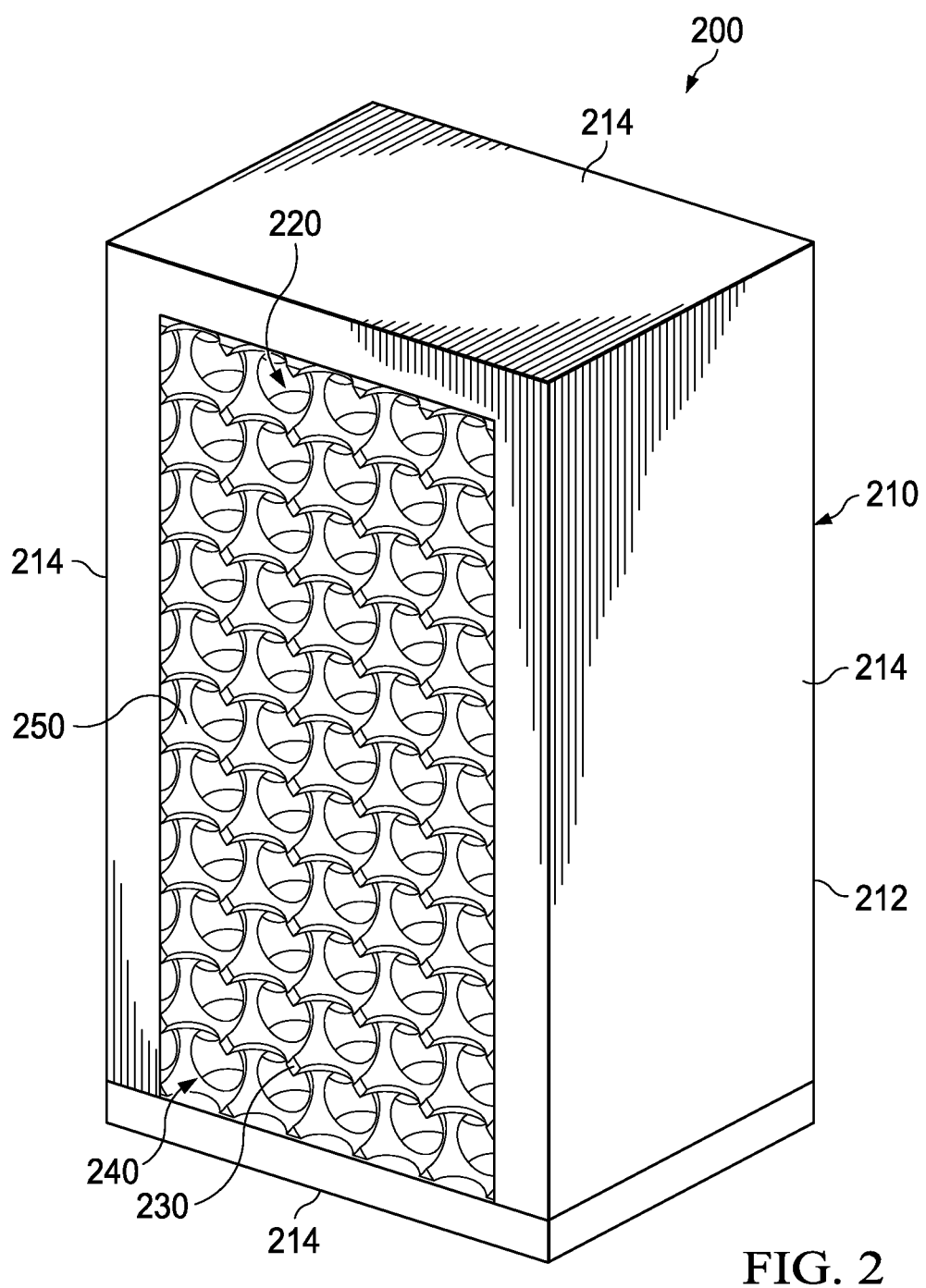
FIG. 2 shows a portion of a heat spreader.

FIG. 2 shows a portion of the heat spreader 200. The heat spreader can be the base body or the cover (e.g., cooling panel) of the RRU, for example. However, the heat spreader 200 can be any cooling device and may have any desired form or design.

The heat spreader 200 comprises an enclosure 210 with a hollow core 220. The hollow core 220 is filled with a foam core 230. The foam core 230 comprises a thermally conductive material 250 perforated with pores or voids 240. The heat spreader 200 comprises a bottom surface 212, side surfaces (walls) 214 and a top surface (not shown). The thermally conductive foam core 230 is sandwiched between the solid outside material skin (surfaces). The surfaces 210 comprise solid thermal conductive material skins and the foam comprises a thermal conductive material perforated with pores or voids.

The solid thermal conductive material surfaces may comprise an average density of less than 5 mg per mm$^3$, less than 3 mg per mm$^3$ or less than 2.7 mg per mm$^3$. Alternatively, the solid terminal conductive material surfaces may comprise an average density between 2 mg per mm³ and 3.5 mg per mm³. At the same time the solid thermal conductive material surfaces may comprise an average thermal conductivity of more than 150 W/(m*K)(Watts per meter Kelvin) or more than 200 W/(m*K). In some embodiments the solid thermal conductive material surfaces may comprise an average thermal conductivity between 150 W(m*K) and 300 W(m*K). The solid thermal conductive material surfaces may be aluminum (such as elemental aluminum) or an aluminum alloy or copper (elemental copper) or a copper alloy. Alternatively, the thermal conductive material surfaces may be a metal with good thermal conductivity and relatively light weight (e.g., titanium or a titanium alloy). In other embodiments the thermal conductive materials surfaces may comprise a thermally conductive plastic material.

The enclosure surfaces 210 comprise a thickness of about 1 mm to 5 mm, depending on applications. Alternatively, the enclosure surface 210 comprises a thickness of about 2 mm to 4 mm.

The thermal conductive foam core 230 (including the pores or voids) may comprise an average density of less than 4 mg per mm³, less than 2.5 mg per mm³ or less than 2 mg per mm³. Alternatively, the thermal conductive foam core 230 may comprise an average density between 1.5 mg per mm³ and 2.5 mg per mm³. At the same time the thermal conductive foam core may comprise an average thermal conductivity of more than 100 W/(m*K)(Watts per meter Kelvin) or more than 150 W/(m*K). In some embodiments the thermal conductive foam core may comprise an average thermal conductivity between 100 W/(m*K) and 200 W/(m*K). The thermal conductive foam core (without the pores or voids) 230 may comprise aluminum (such as elemental aluminum) or an aluminum alloy, or copper (elemental copper) or a copper alloy. Alternatively, the thermal conductive foam core 230 may comprise any other thermal conductive material with a light weight (e.g., titanium or a titanium alloy). In some embodiments the thermally conductive foam core 230 may comprise a thermally conductive plastic material.

The voids or pores 240 may be comprise air. Alternatively, the voids or pores 230 are filled with He, Ar, or some other inert gas. The light weighted material may be substantially lighter than the foam material 250 or the enclosure material 210 (at least 70% or 80%). The void filling (not air) may be thermally conductive material or thermally non-conductive material.

The foam core 230 may comprise a three dimensional matrix structure with voids or pores in between. The three dimension matrix structure may be regular or irregular. The three dimensional matrix structure may comprise matrix elements 250 and connections between the matrix elements. The matrix elements 250 may comprise dimensions of 0.5 mm to 3 mm or 1 mm to 2 mm. The matrix elements 250 may be deformed spheres, deformed pyramids or deformed spherical hexagonal or octagonal structures with round corners. In other embodiments the matrix elements 250 may comprise other three dimensional structures. These structures may be solid or hollow and may have, in some embodiments, a thin film coating disposed on them. The links between the matrix elements 250 connecting these matrix elements 250 may comprise the same materials as the matrix elements and may be solid or hollow as well. In some embodiments the links may be covered with the thin film too.

The foam core 230 may be rigid by itself. It may be fixed to the inner surfaces of the enclosure 210. The foam core 230 may be fixed by soldering or by a thermally conductive adhesive to the inner surfaces.

In some embodiments the heat spreader 200 may be internally partitioned in several sub divisions so that there are several hollow enclosures in the heat spreader 200. Each of the hollow enclosures may be filled with a foam core 230. For example, there are 2, 4, 6, 8, 12 or more such hollow enclosures. The hollow enclosures may be symmetrical or unsymmetrical. The supports that separate the individual enclosures from each other may be strut members stabilizing the heat spreader 200. These supports may be walls that completely seal the hollow enclosures from each other or may be structures such as pillars so that the hollow enclosures are not completely sealed from each other. The supports may comprise the same material as the surfaces. In some embodiments not all the hollow enclosures are filled with a foam core. Some enclosures may be filled with air only.

Figure 3:
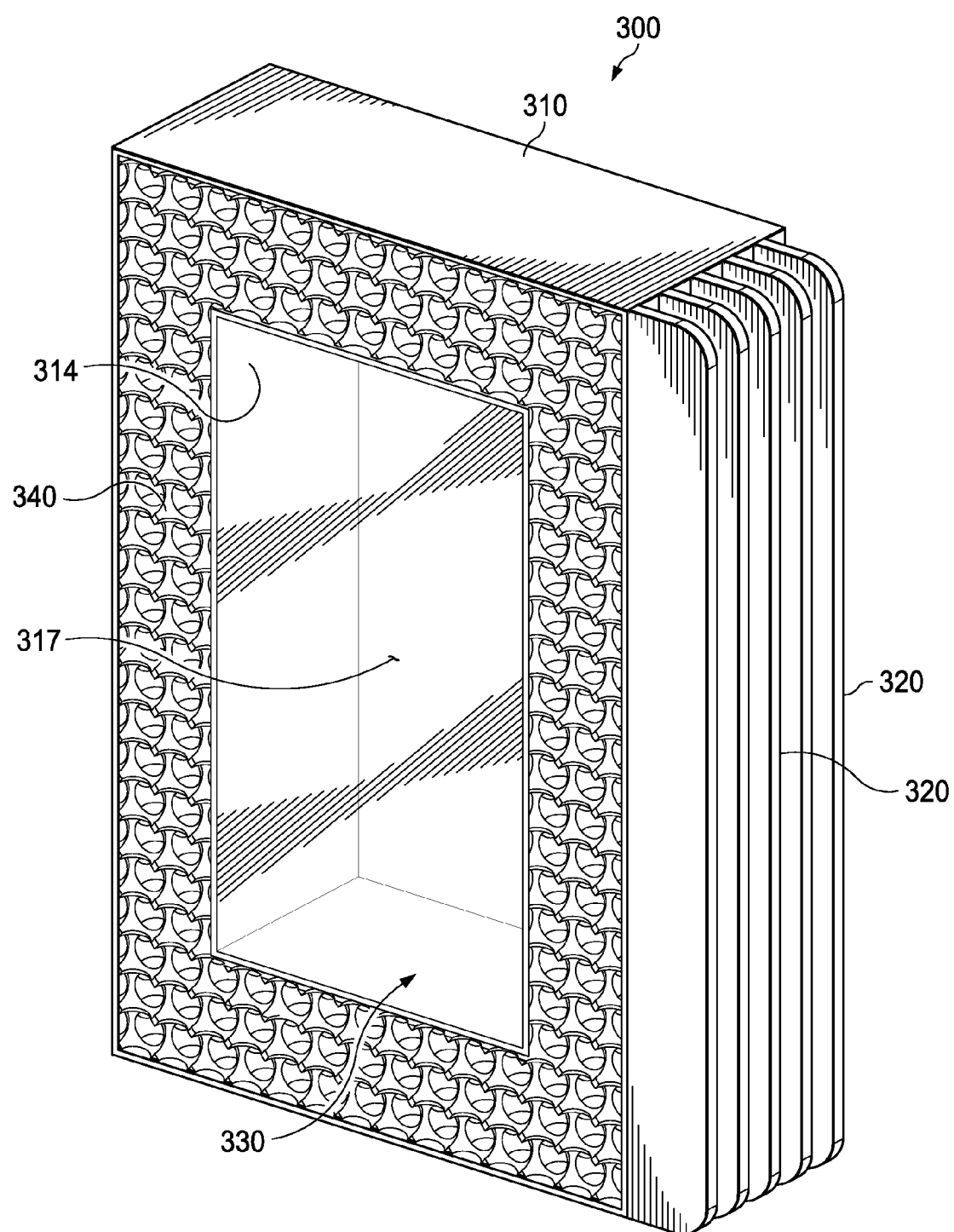
FIG. 3 shows a cross section of a heat spreader with fins.

FIG. 3 shows a three dimensional cross sectional view of a base body 300 of a RRU. The base body comprises a frame 310 and cooling rips or fins 320. The frame 310 comprises a rear surface 317 and solid side surfaces (walls) 314. For a better understanding FIG. 3 does not show at top surface of the base body 300 and the cover of the RRU. The electronic equipment and electronic elements are placed inside 330 the frame 310 (or base body 300) and mounted on the rear surface 317, for example. FIG. 3 shows that the thermally conductive foam core 340 is placed between the side surfaces 314. The thermally conductive foam core 340 may also be placed between a top surface (forming the inside bottom surface of the box) and a bottom surface (forming the bottom surface of the base bode. The bottom surface of the base body may be configured to be mounted to a tower) the rear surface 317. The cooling fins 320 may be solid and may not comprise the thermally conductive foam core.

In some embodiments only the base body of the RRU comprises the hollow enclosure and foam core while the cooling cover is solid and does not comprise a foam core. In other embodiments the base body and the cooling cover comprise the hollow enclosure with the foam core but not the fins disposed on cooling cover or the base body. The rips or fins may be from solid material. In some embodiments, however, the cooling rips or fins may comprise a foam core.

An advantage of this structure is that the weight of heat spreader may be reduced by between 30% to 70%, 40% to 60% or 45% to 55% relative to a conventional heat spreader formed from the same material. Accordingly, the weight of the base body and the cooling panel relative to a loaded RRU (base body, cooling panel and electronic equipment) is not more than 30% or not more than 25% of the overall weight. Alternatively, the relative weight is not more than 20%. This is substantially less than to comparable currently available RRUs where the weight of base body and the cooling panel is in the area of about 50%.

Figure 4:
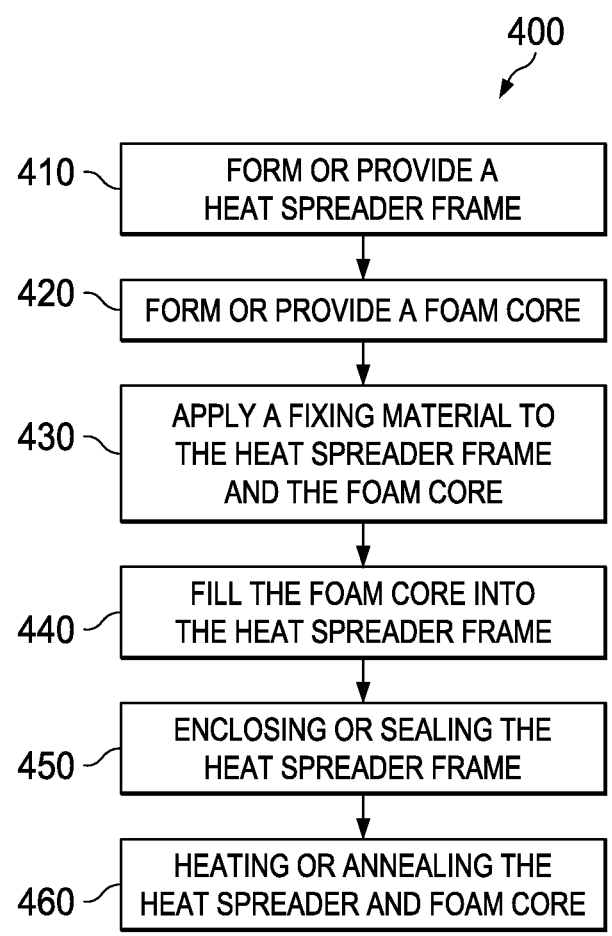
FIG. 4 illustrates a method of manufacturing a heat spreader.

FIG. 4 shows a method for manufacturing a heat spreader 400. In a first step 410 a heat spreader frame is formed or provided. For example, the heat spreader frame may comprise a bottom surface and the side surfaces of an enclosure. The material of the heat spreader frame may comprise aluminum (e.g., elemental aluminum) or an aluminum alloy. In the next step 420 a foam core is formed or provided. The foam core may comprise a three dimensional matrix structure of a thermally conductive material with pores or voids. For example, the foam core may comprise aluminum (e.g., elemental aluminum) or an aluminum alloy and the pores may comprise air. The foam core may be formed by injecting a gas or mixing a foaming agent into molten metal.

Then in the next step, step 430, a fixing material such as a solder material or a thermally conductive adhesive paste (adhesive with a thermally conductive filling) may be applied to the heat spreader frame, the foam core or to both. Then the foam core is placed into the heat spreader frame or the heat spreader is filled with the foam core at step 440. In next step the foam core may be enclosed or sealed. For example, a top surface of the heat spreader may be placed on the heat spreader frame and the foam core is enclosed, step 450. In step 460, the heat spreader may be heated or thermally annealed to fix the foam core to the surfaces inside the heat spreader.

In some embodiments the steps may be altered. In other embodiments a based body and a cooling plate of an RRU may each be formed according to embodiments of the previously described method.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A remote radio unit (RRU) comprising:
   a rear side of the RRU comprising a base plate and sidewalls;
   a single cover for the RRU, the cover covering the rear side, wherein the rear side and the cover form an outside of the RRU and enclose an inside; and
   electronic transceiver circuitry located in the inside of the RRU,
   wherein the cover, the base plate or the sidewalls includes an enclosure with a hollow core formed within the cover, the base plate or the sidewalls, and
   wherein a foam core that comprises pores or voids is disposed and sealed within the hollow core formed within the cover, the base plate or the sidewalls.

2. The remote radio unit according to claim 1, wherein the enclosure comprises a solid thermally conductive material with an average weight of less than 5 mg per mm$^3$ and an average thermal conductivity of more than 150 W per (m*K), and wherein the foam core comprises an average weight of less than 4 mg per mm$^3$ and an average thermal conductivity of more than 100 W per (m*K).

3. The remote radio unit according to claim 1, wherein the enclosure comprises a solid thermally conductive material with an average weight between 2 mg per mm$^3$ and 3.5 mg per mm$^3$ and an average thermal conductivity between 150 W per (m*K) and 300 W per (m*K), and wherein the foam core comprises an average weight between 1.5 mg per mm$^3$ and 2.5 mg per mm$^3$ and an average thermal conductivity between 100 W(m*K) and 200 W(m*K).

4. The remote radio unit according to claim 1, wherein the enclosure comprises aluminum.

5. The remote radio unit according to claim 4, wherein the enclosure comprises elemental aluminum.

6. The remote radio unit according to claim 4, wherein the foam core comprises aluminum.

7. The remote radio unit according to claim 6, wherein the foam core comprises elemental aluminum.

8. The remote radio unit according to claim 1, wherein the foam core comprises a three dimensional matrix structure having matrix elements and the pores or the voids.

9. The remote radio unit according to claim 8, wherein the matrix elements comprise a thermally conductive material and the pores or voids comprise air.

10. A remote radio unit (RRU) comprising:
    a rear side of the RRU comprising a base plate and sidewalls;
    a single cover for the RRU, the cover covering the rear side, wherein the rear side and the cover form an outside of the RRU and enclose an inside; and
    electronic transceiver circuitry located in the inside of the RRU,
    wherein the base plate, the sidewalls, or the cover form(s) a hollow base plate, hollow sidewalls or a hollow cover, and wherein a foam core, which comprises pores or voids, is disposed and sealed within the hollow base plate, the hollow sidewalls or the hollow cover.

11. The remote radio unit according to claim 10, wherein the cover comprises cooling fins, wherein the cooling fins are of a solid material, and wherein a material of the solid material is the same as a material of the hollow cover.

12. The remote radio unit according to claim 10, wherein the foam core comprises a three dimensional matrix structure having matrix elements and the pores or the voids.

13. The remote radio unit according to claim 12, wherein the matrix elements comprise a thermally conductive material and the pores or the voids comprise air.

14. The remote radio unit according to claim 12, wherein the matrix elements comprise a thermally conductive material and the pores or the voids comprise an inert gas.

15. The remote radio unit according to claim 12, wherein the hollow cover comprises a solid thermally conductive material with an average weight of less than 5 mg per mm$^3$ and an average thermal conductivity of more than 150 W per (m*K), and wherein the foam core comprises an average weight of less than 4 mg per mm$^3$ and an average thermal conductivity of more than 100 W per (m*K).

* * * * *